United States Patent [19]

Yonezawa et al.

[11] 4,161,743
[45] Jul. 17, 1979

[54] SEMICONDUCTOR DEVICE WITH SILICON CARBIDE-GLASS-SILICON CARBIDE PASSIVATING OVERCOAT

[75] Inventors: Toshio Yonezawa, Yokosuka; Takashi Ajima, Tokyo; Masato Uchida, Yokohama, all of Japan

[73] Assignee: Tokyo Shibaura Electric Co., Ltd., Japan

[21] Appl. No.: 915,541

[22] Filed: Jun. 14, 1978

Related U.S. Application Data

[63] Continuation of Ser. No. 782,224, Mar. 28, 1977, abandoned.

[51] Int. Cl.² .......................................... H01L 29/34
[52] U.S. Cl. ......................................... 357/54; 357/16; 357/49; 357/60; 427/85; 427/93; 427/228; 427/249
[58] Field of Search ...................... 357/16, 49, 54, 60; 427/85, 93, 95, 228, 249

[56] References Cited

U.S. PATENT DOCUMENTS

| | | | |
|---|---|---|---|
| 2,937,324 | 5/1960 | Kroko | 357/16 |
| 3,157,541 | 11/1964 | Heywang et al. | 357/16 |
| 3,400,309 | 9/1968 | Doo | 357/49 |
| 3,451,867 | 6/1969 | Taft et al. | 148/175 |
| 3,455,020 | 7/1969 | Dawson et al. | 357/54 |
| 3,465,209 | 9/1969 | Denning et al. | 357/54 |
| 3,485,666 | 12/1969 | Sterling et al. | 117/230 |
| 3,497,773 | 2/1970 | Kisinko et al. | 357/49 |
| 3,527,626 | 9/1970 | Brander et al. | 148/33.4 |
| 3,550,256 | 12/1970 | Deal et al. | 29/571 |
| 3,812,519 | 5/1974 | Nakamura et al. | 357/60 |
| 3,858,238 | 12/1974 | Nakamura et al. | 357/60 |
| 3,879,230 | 4/1975 | Nakamura et al. | 148/1.5 |
| 3,967,310 | 6/1976 | Horuichi et al. | 357/54 |

FOREIGN PATENT DOCUMENTS

| | | | |
|---|---|---|---|
| 1589900 | 8/1970 | Fed. Rep. of Germany | 357/54 |
| 47-33548 | 8/1972 | Japan | 357/54 |
| 48-2833 | 1/1973 | Japan | 357/54 |
| 1114798 | 5/1968 | United Kingdom | 357/49 |
| 1142405 | 2/1969 | United Kingdom | 357/54 |
| 1143864 | 2/1969 | United Kingdom | 357/54 |
| 1147014 | 4/1969 | United Kingdom | 357/52 |
| 1162565 | 8/1969 | United Kingdom | 357/49 |
| 1182152 | 4/1970 | United Kingdom | 357/54 |
| 1224801 | 3/1971 | United Kingdom | 357/49 |
| 1334520 | 7/1971 | United Kingdom | 357/91 |

OTHER PUBLICATIONS

A. Healy, "Integrated Semiconductor Device," IBM. Tech. Discl. Bull., vol. 8, #7, Dec. 1965, pp. 1016-1017.

*Primary Examiner*—Joseph E. Clawson, Jr.
*Attorney, Agent, or Firm*—Finnegan, Henderson, Farabow & Garrett

[57] ABSTRACT

A semiconductor device includes a semiconductor substrate and a silicon carbide film formed in direct contact with the surface of the semiconductor substrate. The silicon carbide film may have a proper purity or include at least one element selected from the group consisting of hydrogen, oxygen, nitrogen, helium, argon or chlorine.

22 Claims, 10 Drawing Figures

SEMICONDUCTOR DEVICE WITH SILICON CARBIDE-GLASS-SILICON CARBIDE PASSIVATING OVERCOAT

This is a continuation, of application Ser. No. 782,224, filed Mar. 28, 1977 now abandoned.

This invention relates to a semiconductor device having a novel insulating film or a protective film.

Generally, a semiconductor device, such as a transistor, diode, integrated circuit etc., includes an insulating film or a protective film formed on a semiconductor substrate and electrodes. A typical conventional semiconductor device is shown in FIG. 1. In FIG. 1 an insulating film 4 and protective film 5 are formed in this order on the surface of a semiconductor substrate except for electrode contact surface portions, said semiconductor substrate including a transistor 1 and resistor 2. The insulating film 4 is usually an oxide such as silicon dioxide and the protective film 5 is a phosphorus-doped silicate glass (hereinafter referred to as P-SG) and alumina. Metal electrodes 6, 6' are formed by an aluminum evaporation step and subsequent photoetching step on the electrode contact surface portion of the substrate and an electrical connection, not shown, is made with respect to the electrode. Usually, the electrodes 6, 6' and electrical connection are covered with another insulating film 4' and protective film 5'. Such films are formed to prevent contamination of the semiconductor substrate by an impurity such as an external sodium ion and the consequent deterioration of electrical properties of elements, such as a channel formation, and are called passivation films.

Since, however, the passivation film has a greater hygroscopic property and polarizing effect, this causes the reliability of the semiconductor device to be disadvantageously lowered. Particularly, a PSG film, a typical passivation film, absorbs moisture to produce phosphoric acid, causing metal connections and metal electrodes to be corroded and in worst case to be broken. Furthermore, the conventional passivation film causes, due to its polarizing effect, degradation of collector-emitter breakdown voltage VCED and collector-base breakdown voltage VCBO and a greater noise variation.

Since a conventional planar type semiconductor device is manufactured by the repeated steps of diffusing an impurity through an opened insulating film and effecting a coating operation with another insulating film, some insulating film or films are subjected to several heat treatments. Such insulating film is contaminated with an alkaline metal impurity, such as sodium ion etc., emitted from a soaking pit during heat treatment and a channel is liable to occur at the base region and collector region. On the other hand, a method for improving the noise characteristic etc. of a semiconductor device by improving the structure, per se, of the semiconductor substrate is disclosed in U.S. Pat. Nos. 3,812,519; 3,834,953; 3,858,238 and 3,879,230 to Yonezawa et al. This method is called a perfect crystal device technology (hereinafter referred to as a PCT method) and characterized by forming a first high concentration diffusion region having a first impurity, for example boron, including at least one material exclusive of arsenic and a second diffusion region having a smaller amount of arsenic, for example 3 to 24%, and a second impurity including at least one material, for example phosphorus, exclusive of arsenic so as to reduce lattice defects in said first diffusion region. Since, however, the PCT method is directed to an improvement of a semiconductor substrate per se, it is impossible to remove the above-mentioned drawbacks resulting from the conventional insulating film and protective film.

It is therefore desired to develop an excellent insulating film or a protective film which permits a lower nose semiconductor device.

One object of this invention is to provide a semiconductor device having an insulating film and/or a protective film which are/is excellent in resistance to moisture and free of any polarizing effect.

Another object of this invention is to provide a semiconductor device having a thin film which functions not only as an insulating film but also as a protective film having a blocking effect against a contaminating impurity.

According to this invention there is provided a semiconductor device including a semiconductor substrate and a silicon carbide film formed in direct with the surface of the semiconductor substrate. Preferably, the above-mentioned silicon carbide film may have a proper purity or include at least one element selected from the group consisting of hydrogen, oxygen, nitrogen, helium, argon and chlorine.

In a preferred embodiment of this invention there is provided a semiconductor device including a silicon carbide film or a silicon dioxide film formed on electrodes and electrical connection which are formed on a silicon carbide film in direct contact with a semiconductor substrate.

This invention can be more fully understood from the following detailed description when taken in conjunction with the accompanying drawings, in which.

A silicon carbide film formed in direct contact with the surface of a semiconductor substrate has an electrical insulating property sufficient to act as an insulator. A silicon carbide film formed by a conventional means such as a CVD method (chemical vapor deposition method) utilizing a reaction of silicon tetrahydride ($SiH_4$) and toluene ($C_7H_8$), evaporation method, sputtering method etc. has an electrical insulating property enough to be used according to this invention. Since silicon carbide shows an increasing electrical insulating property with an increase in purity, it is preferred that the silicon carbide film have a high purity. However, a silicon carbide film containing hydrogen, oxygen, nitrogen, helium, argon or chlorine may be employed in this invention. It is because that these elements do no lower the electrical insulating property of silicon carbide. The concentration of these elements in the silicon carbide film should be restricted to an extent to which the crystalline structure and property of the silicon carbide remain essentially unchanged. To explain more in detail, the concentration is preferably in a range of below $10^{22}$ atom/cm$^3$ and more preferably below $10^{21}$ atom/cm$^3$. As an element (hereinafter referred to an impurity) for reducing, as required, the electrical insulating property of silicon carbide exclusive of the above-mentioned elements, silicon carbide having singly or in combination below 5% of Pb, W, Ta, Gd, Ba, Mo, Sr, Zn, Cu, Ni, Co, Fe, Cr, Ti, Ca, K, P, Al, Mg, Na, free C, and B as measured in terms of the number of atoms is considered herein as a pure material and can be applied to this invention. The impurity concentration in the silicon carbide film is preferably below 0.5% and more preferably below 0.2%. It is needless to say that a pure silicon carbide film having little or no impurity is most preferable.

The structure of the semiconductor substrate is not critical and, therefore, this imparts no limitation to this invention. This invention covers a discrete and an IC semiconductor and further covers a planar- and mesa-type transistor as well as a bipolar and MOS transistor. A combination with a semiconductor substrate as obtained by the above-mentioned PCT method is also possible.

A semiconductor device according to one embodiment of this invention will be described by referring to FIG. 2 to FIG. 5.

Figure 2:
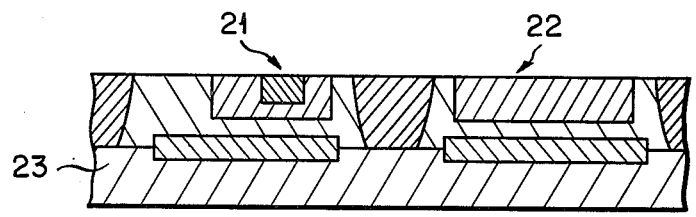
FIGS. 2 to 5 are cross-sectional views schematically showing a process for manufacturing a semiconductor device according to one embodiment of this invention.
Figure 3:
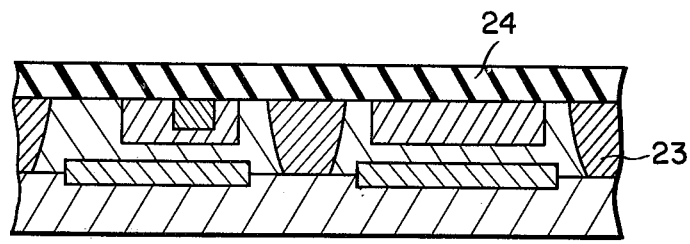
Figure 4:
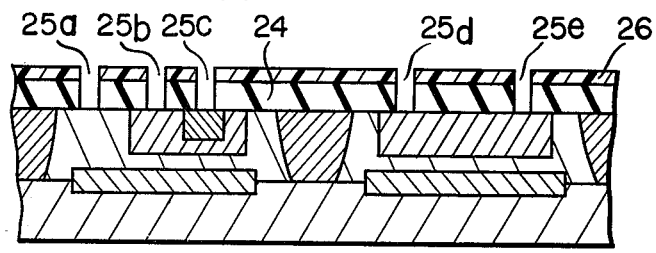
Figure 5:
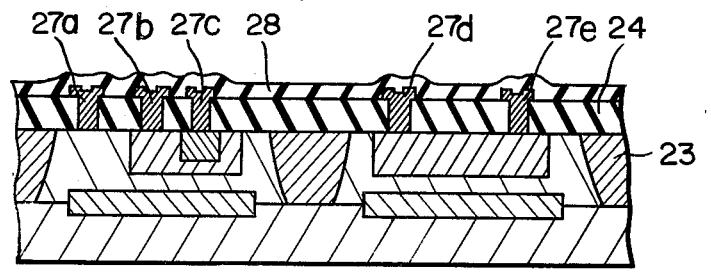

A transistor 21 and resistor 22 are formed by a usual method in a semiconductor substrate 23 and an SiO2 film formed on the surface of the semiconductor substrate 23 is completely removed as shown in FIG. 2. A first silicon carbide film 24 is wholly formed in direct contact with the surface of the semiconductor substrate 23. The silicon carbide film 24 is formed on the surface of the substrate by a CVD method utilizing SiH$_4$ and C$_7$H$_8$, evaporation method, sputtering method etc. and has a thickness of 50Å to 5μ and preferably 1000Å to 1μ. A pattern of photoresist 26 is formed on the silicon carbide film 24 and contact holes 25a, 25b, 25c, 25d and 25e are formed by a plasma etching of CF$_4$ or CF$_4$+O$_2$, as shown in FIG. 4. After the photoresist 26 is removed, aluminium is evaporated on the surface of the resultant semiconductor structure and a photoetching is effected by a usual method on the Al-evaporated surface to provide electrodes 27a, 27b, 27c, and 27e and an electrical connection not shown. Then, a second silicon carbide film 28 is formed on the surface of the resultant structure as shown in FIG. 5.

Instead of a silicon carbide film having a high purity as used in this invention use may be made of a silicon carbide film including at least one element selected from the group consisting of hydrogen, oxygen, nitrogen, helium, argon and chlorine. Such a silicon carbide film including the element or elements is formed by introducing the element or elements into the preformed SiC film by, for example, an ion implantation or CVD method. In order to control a diffusion layer in the semiconductor substrate there is the cases where a temperature at the manufacturing steps of a semiconductor device is controlled to below 1000° C. so as to suppress an increase in current amplification factor and prevent a decrease in VCED as well as an appreciable decrease in VCBO. There is a probability that the silicon carbide film becomes amphorus under this condition. However, the silicon carbide film, even if in the amorphous or crystalline state, can serve adequately as an insulating film or a passivation film and falls under the scope of this invention.

Figure 6:
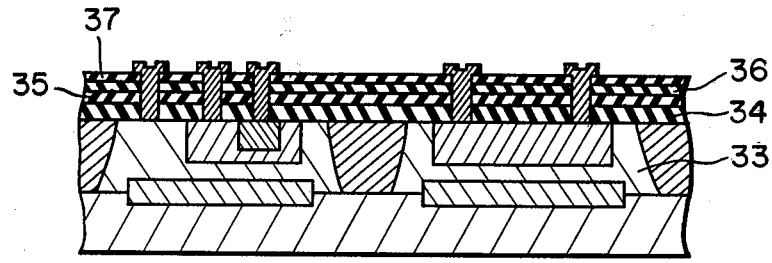
FIG. 6 is a cross-sectional view diagrammatically showing a semiconductor device according to another embodiment of this invention.

Although in the above-mentioned embodiment the second silicon carbide film is formed on the silicon carbide film formed in direct contact with the surface of the semiconductor substrate, a silicon dioxide film may be used instead of the second silicon carbide film. The silicon dioxide film, through formed in the usual method, can be formed by heat treating the preformed silicon carbide film in an oxidizing atmosphere or introducing oxygen in high concentration into the preformed silicon carbide film by an ion implantation method. In such a semiconductor device the silicon carbide film has an advantage of compensating for the stress of the silicon dioxide film. A protective film or passivation film may be formed, as required, on the silicon carbide film formed in direct contact with the surface of the semiconductor substrate. As necessary, a silicon carbide film, SiO$_2$ film or the like may be formed on the surface of said silicon carbide film for insulation purposes. As a known passivation film use may be made of P.As-SG, P.B-SG, P-Sb-SG, Si$_3$N$_4$, silicate glass. A film formed of an oxide made of at least one element selected from the group consisting of P, Al, Pb, B, Ti, Ga, Sn, Zr, Sr, Cr, Mo, W, Ni, Fe, Co and Ta has been known as a protective film or an insulating film. A silicon carbide film of proper purity or a silicon carbide film including at least one element selected from the group consisting of hydrogen, oxyge, nitrogen, helium, argon and chlorine is preferably in a range of 50Å to 5μ in thickness and it may, as required, be formed as a protective film or an insulating film on the silicon carbide film formed in direct contact with the surface of the semiconductor substrate. It has been found that a silicon carbide film including at least one kind of impurity selected from the group consisting of P, Al, Pb, B, Ti, Ga, Zn, Sr, Cr, Mo, W, Ni, Fe, Co and Ta can be used as a protective film or a passivation film. The concentration of an impurity is preferably in a range of $10^{19}$ to $10^{22}$ atom/cm$^3$. A semiconductor device according to the preferred embodiment of this invention is shown in FIG. 6. In this embodiment a pure silicon carbide film 34 is formed in direct contact with the surface of the semiconductor substrate 33. A PSG film 35, a silicon carbide film 36 includng an impurity, and a SiO$_2$ film 37 are formed in this order on the surface of the silicon carbide film 34. According to this invention, however, no limitation is made to the construction of a protective film or an insulating film which is formed on the silicon carbide film formed in direct contact with the surface of the semiconductor substrate.

It is to be noted that the silicon carbide film in direct contact with the surface of the semiconductor substrate serves singly as an insulating film or a passivation film. For this reason, the semiconductor device having only the silicon carbide film formed on the surface of the semiconductor substrate is covered as the preferred embodiment of this invention.

A semiconductor device using such silicon carbide film in place of a gate SiO2 film of a conventional MOS transistor is also covered as another preferred embodiment of this invention. Since such a silicon carbide gate insulated film has an excellent passivation effect and excellent impurity blocking effect, the conversion voltage can be uniformly controlled at low level. In consequence, a MOS transistor having a silicon carbide gate insulated film requires less dissipation power than that of a conventional counterpart.

The silicon carbide film has excellent resistance to heat and moisture and less polarization effect, providing a semiconductor device an improved reliability and involving no deterioration of $V_{CED}$, $V_{CBO}$ etc. Furthermore, there is no $SiO_2$ film contaminated, under heat treatment etc., with an impurity such as sodium ion, and the silicon carbide film prevents a substrate contamination by an impurity, prominently improving the properties, in particular, noise property, of the semiconductor device.

A semiconductor device having a silicon carbide film formed in direct contact with the surface of a semiconductor substrate fabricated by a PCT method as disclosed in U.S. Pat. No. 3,812,519 provides very much improved element characteristics such as noise characteristics.

Figure 1:
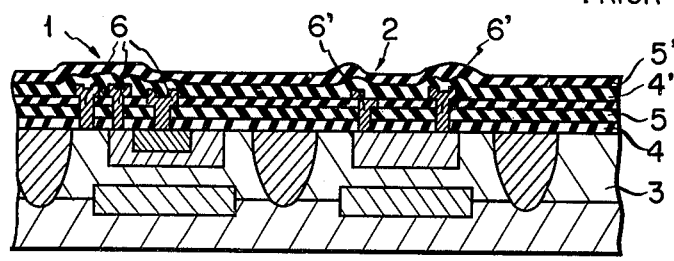
FIG. 1 is a cross-sectional view schematically showing a conventional semiconductor device.
Figure 7:
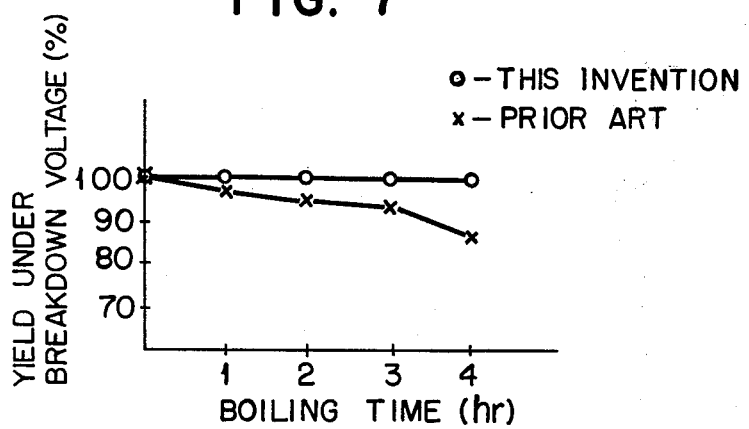
FIG. 7 is a graph showing a relation of a yield under breakdown voltage to a time in which the device of this invention and conventional device are immersed into a boiling water.
Figure 8:
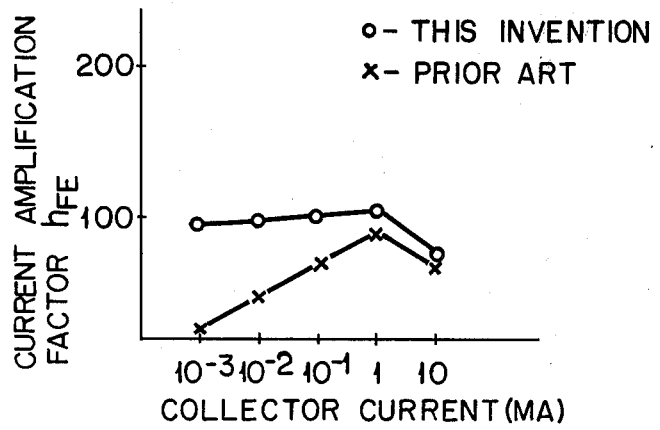
FIG. 8 is a graph showing a comparison in current amplification factor between the device of this invention and the conventional device.
Figure 9:
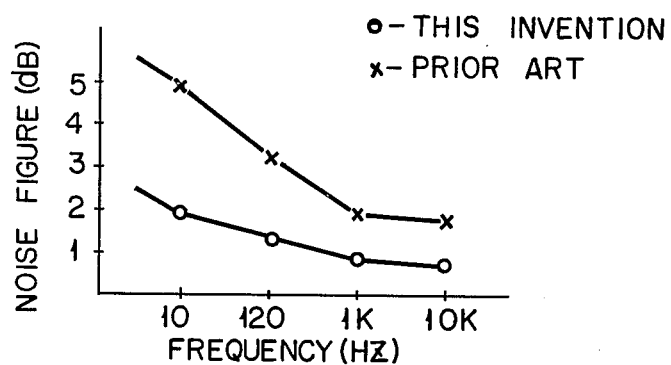
FIG. 9 is a graph showing a comparison in noise figure between the device of this invention and the conventional device.

FIGS. 7 to 9 show a comparison in properties between the conventional semiconductor device having an arrangement shown in FIG. 1 and a semiconductor device according to this invention which is fabricated as shown in FIG. 5.

That is, FIG. 7 shows a yield (%) under breakdown voltage which is observed between the semiconductor device plotted as the symbol "0" and the conventional semiconductor device plotted as the symbol "X". As will be seen from FIG. 7 the semiconductor device according to this invention, even after immersed into a boiling water for four hours, shows a substantially 100% yield, i.e., a more than about 10% improvement over the conventional semiconductor device. The term "the yield under breakdown voltage" is intended to mean a percentage against all the numbers of samples tested under the conditions that the sample, after immersed into a boiling water for a predetermined time period, shows a surface leak current of $0.1\mu A$ with $V_{CBO}$ at 100V.

As will be apparent from FIG. 8 in which an emitter-grounded current amplification factor $h_{FE}$ as shown, the semiconductor device according to this invention revealed, due to excellent passivation effect and blocking effect of the SiC film, no appreciable recombination current at the substrate surface and no appreciable decrease of $h_{FE}$ even at a low current region. A relative difference in $h_{FE}$ between two transistors formed in a single chip i.e. a pair characteristic, was about 1%.

FIG. 9 shows a noise figure as measured with $I_C=100\mu A$, $V_{CE}=3V$ and $Rg=1k\Omega$. As will be apparent from FIG. 9, the semiconductor device of this invention showed a noise figure of about 2dB at a frequency of 10Hz i.e. one half the value of the conventional counterpart.

The semiconductor device having a silicon carbide film formed in direct contact with the substrate surface, even if arranged in a manner different from that of FIG. 5, showed substantially the same results as mentioned above, in respect of a yield under breakdown voltage, a current amplification factor, a noise figure etc. Since a semiconductor device of this invention, which has a semiconductor substrate formed by the above-mentioned PCT method, has undergone stress compensation in the substrate, indicated somewhat more desirable results than the above-mentioned embodiments in respect of the above-mentioned characteristics.

Figure 10:
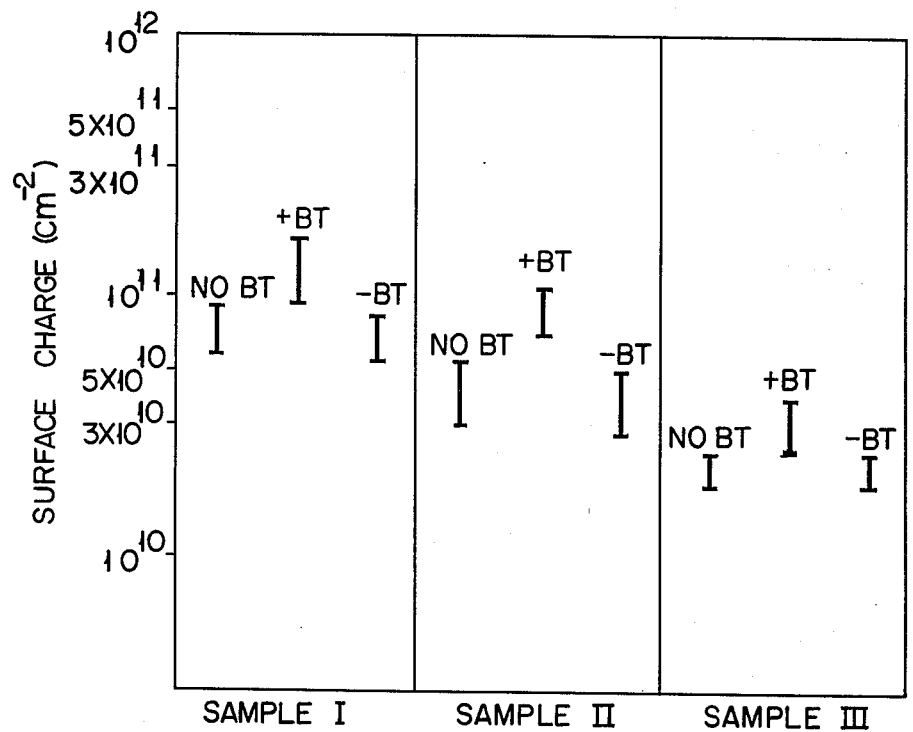
FIG. 10 is a graph showing a comparison in surface charge between the device of this invention and the conventional device.

There were prepared Sample I (prior art) having an $SiO_2$ film formed on the surface of an Si substrate formed by the PCT method, Sample II (prior art) having an $Si_3N_4$ film formed on the $SiO_2$ film shown in Sample I, and Sample III (this invention) having an SiC film formed on the surface of an Si substrate formed by the PCT method. An amount of surface charge, $N_{FB}$, per unit area was measured for each Sample, the results of which are shown in FIG. 10. That is, a reverse bias was applied between the electrodes of each device without a BT treatment as will be described later and an extension of a depletion layer was measured (Symbol No. BT). After +BT and −BT treatments, an amount of mobile ions present was measured as indicated by symbols +BT and −BT. The "BT treatment" as defined here is intended to means that a positive or negative voltage $10^6$V/cm is applied as a bias while the semiconductor device is held at 300° C. for 10 minutes. The $N_{FB}$ permits overall evaluation of a mobile charge, surface state density etc. and overall judgment of the passivation effect and blocking effect of the insulating film and/or protective film formed on the semiconductor device. As will be apparent from FIG. 10 the semiconductor device of this invention is much improved over the conventional counterpart.

What we claim is:

1. A semiconductor device comprising a semiconductor substrate including an exposed surface having a plurality of P-N junctions disposed thereon, and an insulative and protective film, said film including a first silicon carbide layer adhered to and substantially covering said surface; a layer of a silicate glass adhered to and substantially covering said first silicon carbide layer, said silicate glass being selected from the group consisting of P-SG, P.As-SG, and P.Sb-SG where "SG" means "silicate glass"; and a second silicon carbide layer adhered to and substantially covering said silicate glass layer.

2. A semiconductor device according to claim 1, in which said first silicon carbide film has an impurity concentration of below 5% measured in terms of the number of atoms, said impurity reducing the electrical insulating property of the silicon carbide film and including one or more elements of the group consisting of Pb, W, Ta, Ga, Ba, Mo, Sr, Zn, Cu, Ni, Co, Fe, Cr, Ti, Ca, K, P, Al, Mg, Na, free C and B.

3. A semiconductor device according to claim 2, in which said impurity concentration is below 0.5%.

4. A semiconductor device according to claim 2, in which said impurity concentration is below 0.2%.

5. A semiconductor device according to claim 1, in which said first silicon carbide film consists essentially of pure silicon carbide.

6. A semiconductor device according to claim 1, in which said first silicon carbide film includes an element of at least one kind selected from the group consisting of hydrogen, oxygen, nitrogen, helium, argon and chlorine.

7. A semiconductor device according to claim 6, in which the concentration of the above-mentioned element in said silicon carbide film is below $10^{22}$ atom/cm$^3$.

8. A semiconductor device according to claim 7, in which the concentration of the above-mentioned element in said silicon carbide film is below $10^{21}$ atom/cm$^3$.

9. A semiconductor device according to claim 1, in which said first silicon carbide film has a thickness of 50Å to 5μ.

10. A semiconductor device according to claim 9, in which said silicon carbide film has a thickness of 1000Å to 1μ.

11. A semiconductor device according to claim 1, in which said first silicon carbide film is formed of a crystalline silicon carbide.

12. A semiconductor device according to claim 1, in which said silicon carbide film is formed of an amorphous silicon carbide.

13. A semiconductor device according to claim 1, in which said second silicon carbide film including at least one kind of impurity selected from the group consisting of P, Al, Pb, B, Ti, Ga, Zn, Zr, Sr, Co, W, Ni, Fe, Co and Ta.

14. A semiconductor device according to claim 13, in which the concentration of said impurity is $10^{19}$ to $10^{22}$ atom/cm$^3$.

15. A semiconductor device according to claim 1, in which said second silicon carbide film includes at least one kind of element selected from the group consisting of hydrogen, oxygen, nitrogen, helium, argon and chlorine.

16. A semiconductor device according to claim 1, in which said second silicon carbide film consists essentially of pure silicon carbide.

17. A semiconductor device according to claim 1, in which said second silicon carbide film has a thickness of 50 to 5μ.

18. A semiconductor device according to claim 1, in which said first silicon carbide film is a gate insulated film of a MOS transistor.

19. A semiconductor device according to claim 1, in which said semiconductor substrate is of the kind having a first high concentration diffusion region into which at least one kind of first impurity exclusive of arsenic is diffused, and a second diffusion region into which a second impurity exclusive of arsenic and arsenic are diffused, said second region having a smaller number of arsenic atoms than the number of said second impurity atoms for reducing lattice defects.

20. A semiconductor device according to claim 19, in which said second diffusion region has arsenic equal in amount of 3 to 24% of the amount of said second impurity in said second diffusion region.

21. A semiconductor device as in claim 1 wherein electrodes contacting the different electrical regions making up the P-N junctions on the substrate surface are fomred on said second silicon carbide layer, the device further comprising a third silicon carbide layer adhered to and completely covering said second layer and said electrodes.

22. A semiconductor device according to claim 21, in which said third silicon carbide film has a thickness of 50Å to 5μ.

* * * * *